US010833384B2

(12) United States Patent
Gumann et al.

(10) Patent No.: US 10,833,384 B2
(45) Date of Patent: Nov. 10, 2020

(54) THERMALIZATION OF MICROWAVE ATTENUATORS FOR QUANTUM COMPUTING SIGNAL LINES

(71) Applicant: International Business Machines Corporation, Armonk, NY (US)

(72) Inventors: Patryk Gumann, Tarrytown, NY (US); Salvatore Bernardo Olivadese, Stamford, CT (US); Robert Meinel, Briarcliff Manor, NY (US); Christopher Surovic, Carmel, NY (US); Raymond A. Watters, Clintondale, NY (US); Jerry M. Chow, White Plains, NY (US); Jay M. Gambetta, Yorktown Heights, NY (US); David C. Mckay, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/020,401

(22) Filed: Jun. 27, 2018

(65) Prior Publication Data
US 2020/0006832 A1 Jan. 2, 2020

(51) Int. Cl.
*H01P 1/22* (2006.01)
*G06N 10/00* (2019.01)
(Continued)

(52) U.S. Cl.
CPC ............. *H01P 1/225* (2013.01); *G06N 10/00* (2019.01); *H01P 5/026* (2013.01); *H01P 11/00* (2013.01); *H03H 7/24* (2013.01); *H03H 11/24* (2013.01)

(58) Field of Classification Search
CPC .......... H03H 11/24; H03H 7/24; G06N 10/00; H01P 1/22; H01P 1/225
(Continued)

(56) References Cited

U.S. PATENT DOCUMENTS

| 3,184,694 A | 5/1965 | Weinschel |
| 3,736,656 A * | 6/1973 | Aupoix ................. H01B 12/02 |
| | | 29/599 |

(Continued)

FOREIGN PATENT DOCUMENTS

| CN | 103697647 A | 4/2014 |
| CN | 102637935 | 9/2014 |
| CN | 204144404 | 2/2015 |

OTHER PUBLICATIONS

Yeh, et al., "Microwave attenuators for use with quantum devices below 100 mK," Journal of Applied Physics 121, 224501 (2017), 8 pages.

(Continued)

*Primary Examiner* — Stephen E. Jones
(74) *Attorney, Agent, or Firm* — Amin, Turocy & Watson, LLP

(57) ABSTRACT

The technology described herein is directed towards microwave attenuators, and more particularly to a cryogenic microwave attenuator device for quantum technologies. In some embodiments, a device can comprise a cryogenic microwave attenuator device. The cryogenic microwave attenuator device can comprise: a housing component and a microwave attenuator chip, wherein the housing component can have thermal conductivity of about at least 0.1 Watts per meter-Kelvin at 1 degree Kelvin. The cryogenic microwave attenuator device can also comprise a microwave connector comprising a signal conductor that is direct wire coupled to the microwave attenuator chip.

25 Claims, 7 Drawing Sheets

(51) Int. Cl.
*H01P 5/02* (2006.01)
*H01P 11/00* (2006.01)
*H03H 11/24* (2006.01)
*H03H 7/24* (2006.01)

(58) Field of Classification Search
USPC .......................................... 333/81 R, 81 A
See application file for complete search history.

(56) References Cited

U.S. PATENT DOCUMENTS

| | | | |
|---|---|---|---|
| 3,932,761 A * | 1/1976 | Ramsey | G02B 6/421 250/552 |
| 4,734,661 A | 3/1988 | Shores et al. | |
| 4,777,456 A | 10/1988 | Andrikian et al. | |
| 4,978,932 A | 12/1990 | Gupta et al. | |
| 5,044,165 A | 9/1991 | Linner et al. | |
| 5,683,255 A * | 11/1997 | Menze | H01R 13/646 439/63 |
| 6,335,548 B1 * | 1/2002 | Roberts | H01L 23/49562 257/98 |
| 6,565,556 B1 * | 5/2003 | Korpan | A61B 18/02 606/20 |
| 8,568,149 B1 * | 10/2013 | Vackar | H01R 24/50 439/63 |
| 2009/0180255 A1 | 7/2009 | Soares et al. | |
| 2012/0135867 A1 | 5/2012 | Thom et al. | |
| 2017/0257074 A1 * | 9/2017 | Yeh | G06N 99/00 |

OTHER PUBLICATIONS

International Search Report and Written Opinion received for PCT Application Serial No. PCT/EP2019/065580 dated Nov. 15, 2019, 13 pages.

\* cited by examiner

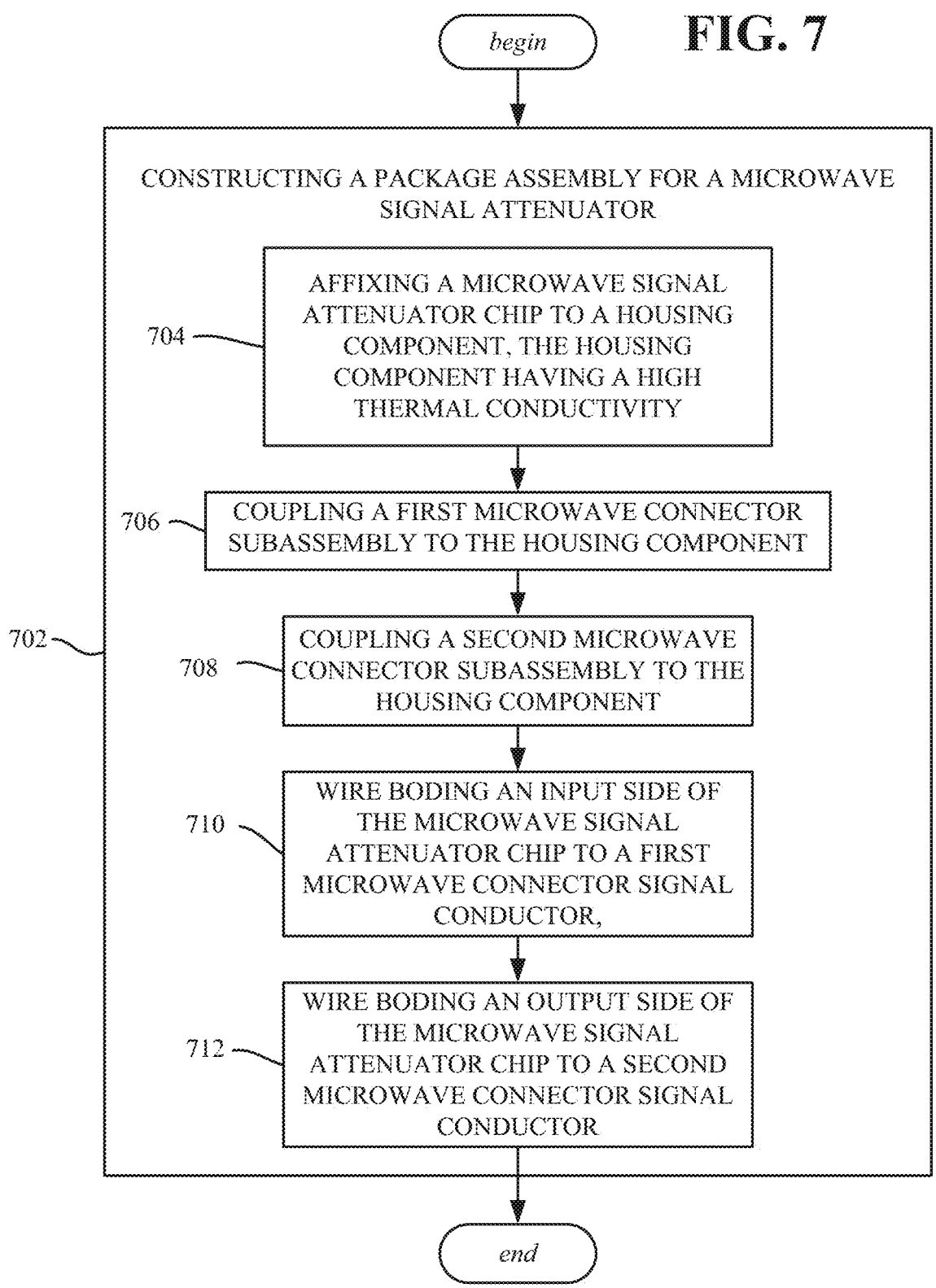

THERMALIZATION OF MICROWAVE ATTENUATORS FOR QUANTUM COMPUTING SIGNAL LINES

BACKGROUND

The subject disclosure relates generally to microwave attenuators, and more particularly to a cryogenic microwave attenuator device for quantum technologies. The fundamental unit of a quantum computer is the quantum bit (qubit). A quantum bit is a quantum mechanical system where information can be encoded, stored and manipulated. The coherence time of a qubit defines the time for how long a quantum state can be maintained in the quantum bit.

The performance of a superconducting based quantum architecture is dependent on the quality of the superconducting qubits/quantum processors, which can be characterized by measuring coherence times. These coherence times depend many factors one of which is the performance of microwave hardware components at low temperatures. For example, in quantum computing devices, microwave components, and in particular microwave attenuators (used to transmit and attenuate noise as well as microwave signals), are needed for use in dilution refrigerators (cryostats) to deliver clean, low-noise microwave signals to the qubits. While some low temperature microwave attenuators are commercially available, such devices do not work well at the very low (e.g., 50 degrees Kelvin (K) to 1 K) and ultra-low milliKelvin (mK) temperatures, for example there are five distinct temperature regions in a dilution refrigerators: ~50 K, ~4 K, 0.7 K, 0.1 K, and base temperature, typically ~10 mK.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a device can comprise a cryogenic microwave attenuator device, the cryogenic microwave attenuator device comprising a housing component and a microwave attenuator chip. The housing component can have thermal conductivity of about at least 0.1 Watts per meter-Kelvin at 1 degree Kelvin. The device can further comprise a microwave connector, the microwave connector comprising a signal conductor that is direct wire coupled to the microwave attenuator chip. Advantages include that the cryogenic microwave attenuator device provides better and faster thermalization, and therefore cleaner microwave signals. The housing component can comprise a copper alloy housing material, e.g., a substantially oxygen-free-high-thermal conductivity copper material or an electrolytic copper material. The housing component can be plated with an oxidation-resistant material, e.g., gold, to resist oxidization of the housing component. A signal conductor can comprise a connector center pin that is direct wire coupled to the microwave attenuator chip via one or more gold wires. Advantages include that the microwave connector is more desirably thermalized, which improves the functionality of the quantum processors.

According to another embodiment, a device can comprise a housing component that contains a microwave signal attenuator chip, the housing component comprising a metal having a thermal conductivity of about at least 1 Watts per meter-Kelvin at 1 degree Kelvin. The device can also comprise a first subassembly that is mechanically coupled to the housing component, the first subassembly comprising a first microwave connector having a first microwave signal conductor electrically coupled to an input side of the microwave signal attenuator chip. The device can further comprise a second subassembly that is mechanically coupled to the housing component, the second subassembly comprising a second microwave connector having a second microwave signal conductor electrically coupled to an output side of the microwave signal attenuator chip. The first microwave connector can comprise a female gender microwave connector and the second microwave connector can comprise a female gender microwave connector. Advantages of having the same gender connector include reducing the number of connectors reduces signal reflections.

According to yet another embodiment, a method is provided. The method can comprise constructing a package assembly for a microwave signal attenuator device, comprising: affixing a microwave signal attenuator chip to a housing component, the housing component having a thermal conductivity of about at least 0.1 Watts per meter-Kelvin at 1 degree Kelvin. The method can further comprise coupling a first microwave connector subassembly to the housing component and coupling a second microwave connector subassembly to the housing component. Other aspects of the method can comprise wire bonding an input side of the microwave signal attenuator chip to a first microwave connector signal conductor, and wire bonding an output side of the microwave signal attenuator chip to a second microwave connector signal conductor. Advantages include that the microwave connector subassemblies are more desirably thermalized, which improves the functionality of the quantum processors.

According to another embodiment a device can comprise an input microwave connector component comprising an input signal conductor, the input signal conductor electrically coupled to an input of a microwave signal attenuator chip. The device can further comprise an output microwave connector component comprising an output signal conductor, the output signal conductor electrically coupled to an output of the microwave signal attenuator chip. The device can further comprise a housing component, the housing component having a first thermal conductivity of about at least 0.1 Watts per meter-Kelvin at 1 degree Kelvin. The housing component can be affixed to the microwave signal attenuator chip with a fastening material having a second thermal conductivity of about at least 0.1 Watts per meter-Kelvin at 1 degree Kelvin. The housing component can be mechanically coupled to the input microwave connector component and to the output microwave connector component. Advantages include better thermalization, which improves the functionality of the quantum processors.

According to yet another embodiment, a cryogenic microwave attenuator device is described. The cryogenic microwave attenuator device can comprise a housing component having a thermal conductivity of about at least 0.1 Watts per meter-Kelvin at 1 degree Kelvin. The housing component can be coupled to dissipate thermal energy of a microwave signal attenuator chip contained within the housing component. The cryogenic microwave attenuator device can comprise an input microwave connector component mechanically coupled to the housing component. The input microwave connector component can comprise an input signal conductor direct wire bonded to an input of the microwave signal attenuator chip. An output microwave connector component can be mechanically coupled to the housing component. The output microwave connector component can comprise an output signal conductor direct wire bonded to an output of the microwave signal attenuator chip. To dissipate the thermal energy, the housing component can be coupled to the microwave signal attenuator chip via a fastening material having a thermal conductivity of about at least 0.1 Watts per meter-Kelvin at 1 degree Kelvin. At least one advantage of the materials and design of the cryogenic microwave attenuator device is that the functionality of the quantum processors is improved.

DESCRIPTION OF THE DRAWINGS

FIG. 7 is a representation of a method that provides a cryogenic-attenuator device according to an example embodiment of the present disclosure.

DETAILED DESCRIPTION

Figure 1:
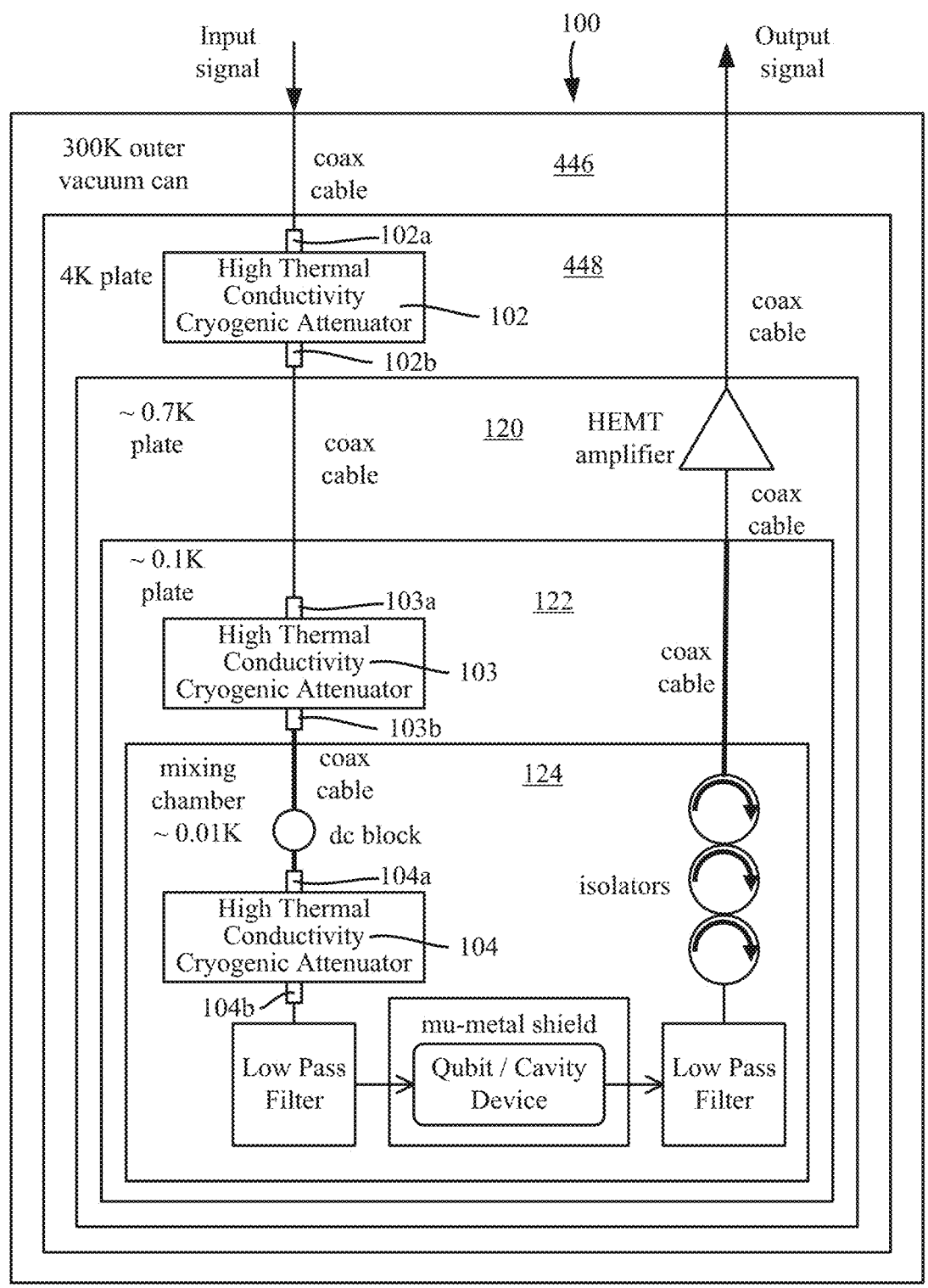
FIG. 1 is a block diagram showing example components for transmitting microwave control signals though coaxial control lines within a dilution refrigerator, using cryogenic microwave attenuators with high thermal conductivity, according to one or more example embodiments of the present disclosure.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures, substrate materials and process features, and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there are no intervening element(s) present. Note that orientation is generally relative; e.g., "on" or "over" or "upper" or "lower" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment," as well any other variations, appearing in various places throughout the specification are not necessarily all referring to the same embodiment. Repetitive description of like elements employed in respective embodiments is omitted for sake of brevity.

In general, a problem is that known microwave attenuators do not have sufficiently good thermal performance and microwave performance at very low (e.g., 4 Kelvin, or 4K) and ultra-low (mK, such as 0.1 K) temperatures. One or more solutions described herein provide for more optimal thermalization of attenuators used in a dilution refrigerator, thus providing improved qubit performance/coherence times, while retaining a suitable microwave response for the attenuator. As will be understood, the microwave attenuator technology described herein solves many thermalization issues in microwave transmission lines in dilution refrigerators in quantum applications.

The technology described herein is generally directed towards a microwave attenuator device suitable for use with quantum computing technologies at cryogenic temperatures, including for use at the ultra-low temperatures (e.g., 0.01K) of a dilution refrigerator's mixing chamber. In general, the technology is based on the use of high thermal conductivity materials. To this end, various high thermal conductivity components are provided, including a high thermal conductivity package assembly (e.g., made of diamond, silver or copper alloy) comprising a pair of microwave control signal line connector components and a housing component that contains the attenuator chip. Further, the substrate onto which the resistive film element of the attenuator chip is evaporated needs high thermal conductivity to dissipate thermal energy into the housing component ground plane and thus into the dilution refrigerator plate; for temperatures above about 4K, sapphire, quartz and diamond can be used as the substrate, while for temperatures below about 4K (e.g., 0.7K or 0.01K) gallium arsenide or fused silicon can be used as the substrate.

Further, the microwave control signal line connector components can be designed to be of the same gender, e.g., female at each end, unlike commercially available attenuators. This avoids the need for an adapter(s) to connect the attenuator device to the microwave control signal lines, and thus minimizes the amount of microwave connections, thereby reducing the number of reflection points in the microwave control lines for the quantum processors (which increases the fidelity of the qubit control pulses)

Referring now to the drawings in which like numerals represent the same of similar elements, FIG. 1 shows an example circuit/quantum application 100 in which high-thermal conductivity cryogenic-microwave attenuator devices 102-104 can be implemented in a dilution refrigerator. Although FIG. 1 shows three attenuator devices 102-104 as an example, it is understood that there are typically five plates (50K plate, 4K plate 0.7K plate, 0.1K plate and the mixing chamber plate at a base temperature of around 0.01K to 0.03K, generally referred to as 10 mK), and that there can be attenuator devices at any plate level, in a dilution refrigerator, with multiple attenuator devices (one per signal line) at every plate. Note that the exemplified attenuator device 102 has a pair of coaxial connectors 102a and 102b, the exemplified attenuator device 103 has a pair of coaxial connectors 103a and 103b, and the exemplified attenuator device 104 has a pair of coaxial connectors 104a and 104b.

In general, quantum applications need microwave attenuators on the input/output control signal lines of a dilution refrigerator to reduce signal magnitude, reduce thermal noise, and thermalize conductors. The input signal into a quantum device is attenuated, as can be the output signal from the dilution refrigerator to measurement devices. As is known, the attenuation is substantially equal over a large frequency band, and thus the technology described herein works well in the circuit/quantum application 100 of FIG. 1. The microwave signals are thus attenuated to provide relatively clean signals throughout the temperature changes, while thermal energy is dissipated through the other metals and high thermal conductivity substrates.

Figure 2:
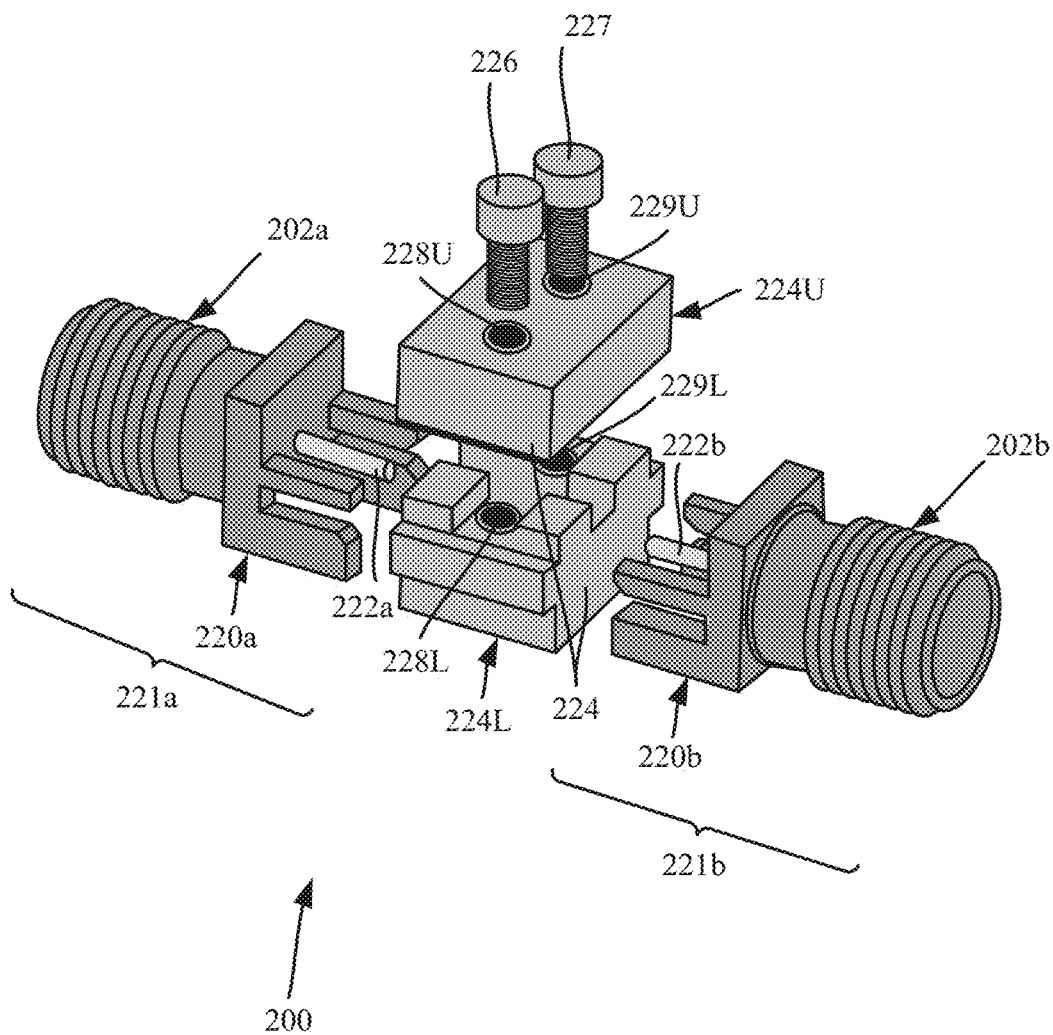
FIG. 2 is a perspective view of a cryogenic microwave attenuator device with high thermal conductivity subassemblies including same-gender connectors in a disassembled state according to one or more example embodiments of the present disclosure.

FIG. 2 shows a perspective view of an example attenuator device 200 shown in a disassembled state. In this example embodiment, shielded (e.g., coaxial or simply coax) microwave connectors 202a and 202b are coupled to coax coupling portions 220a and 220b, respectively. Such fixed subassembly couplings can be accomplished as part of manufacturing by welding, casting parts together or the like to generally form a single fixed subassembly 221a or 222b upon construction/production. The microwave connectors 202a and 202b can be SMA (e.g., SMA-F), SMP (e.g., SMP-F), or other known microwave connector designs, or can be custom designs. As shown in FIG. 2, there are two such subassemblies per attenuator device, which as described herein can be of the same gender (e.g., both female), one subassembly 221a on one end of the attenuator device 200 and the other subassembly 221b at the opposite end. Center conductors of the shielded signal lines, comprising center pins 222a and 222b of the (e.g., coax) microwave connectors 202a and 202b, respectively, extend towards the center of the attenuator device 200, and as understood are electrically insulated from the (e.g., grounded) coax coupling portions 220a and 220b.

Further represented in FIG. 2 are an upper housing portion 224U and a lower housing portion 224L. The housing portions 224U and 224L (as well as the subassemblies 221a and 221b) can be made of oxygen-free high conductivity copper, or electrolytic copper, plated (e.g. gold plated) to resist oxidation. For example, various copper alloys (e.g., C101, C102, C103, C110) can be used. The housing component can comprise a copper alloy (or platinum, silver, gold, brass, aluminum (aluminum above 1.3K temperatures only)) material, e.g., a substantially oxygen-free-high-conductivity copper material or an electrolytic copper material, such that the thermal conductivity of the housing component dissipates thermal energy of the microwave attenuator component. The housing component can be plated with an oxidation-resistant material, e.g., gold, to resist oxidization of the housing component.

In general, and as described herein, the coax coupling portions 220a and 220b can be press fit or otherwise mechanically fastened (e.g., clamped/screwed together, glued, welded or the like) to the lower housing portion 224L, and possibly fastened to an extent to one another. A microwave signal attenuator chip 550 (FIG. 5) is attached (e.g., soldered or otherwise adhered) to the lower housing portion 224L, with leads extending from the microwave signal attenuator chip 550 bonded to the center pins 222a and 222b of the coax microwave connectors 202a and 202b. In the example of FIG. 2, a press fit connection is shown, facilitated at least in part by arms of the coax coupling portions 220a and 220b extending towards the lower housing portion 224L, which has slots arranged to accept the arms with a suitably close fit; the arms can also extend to fit to some extent into corresponding counterpart arms with receptacles.

The upper housing portion 224U is fastened to the lower housing portion 224L. Screws 226 and 227, with corresponding upper screw receptacles 228U, 228L and lower screw receptacles 229U, 229L, with at least the lower screw receptacles 228L and 229L being threaded, are shown as providing the fastening mechanism. Notwithstanding, any suitable fastening mechanism(s) may be used.

Figure 3:
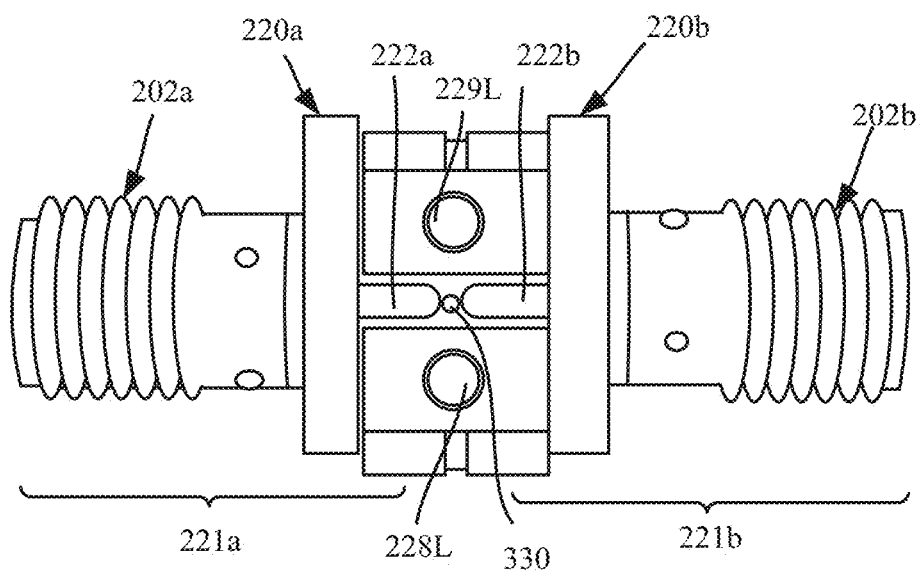
FIG. 3 is top view of a cryogenic microwave attenuator device with high thermal conductivity subassemblies including same-gender connectors in a partially assembled state according to one or more example embodiments of the present disclosure.
Figure 4:
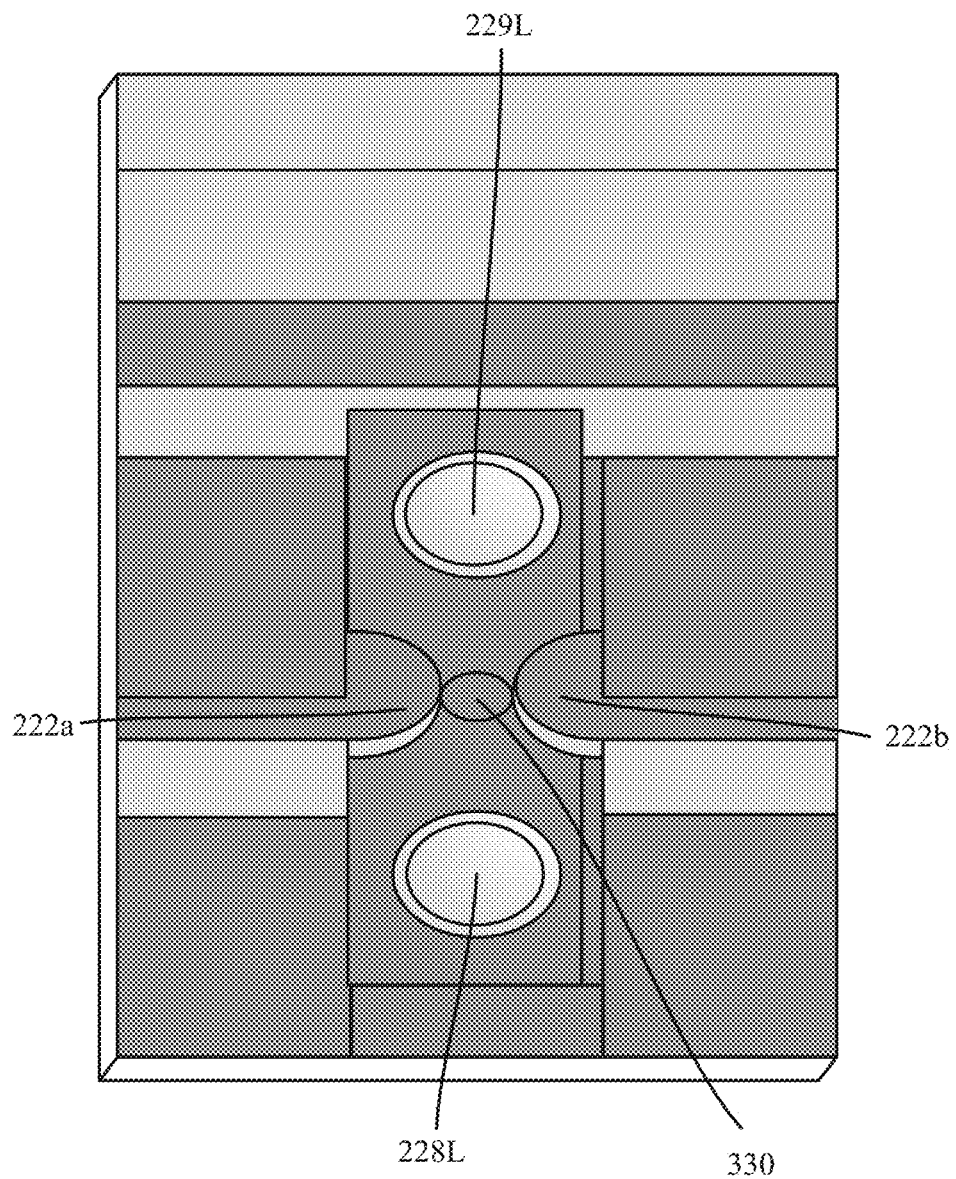
FIG. 4 is a zoomed in view of part of a cryogenic microwave attenuator device according to one or more example embodiments of the present disclosure.

FIG. 3 shows a top view of the example attenuator device 200 in a partially assembled state, that is, with the subassemblies 221a and 221b and lower housing portion 224L press fit together in this example, but without the upper housing portion 224U fastened to the rest of the attenuator device 200. The generally centered area labeled 330 is where the chip will be positioned, that is, between the center pins 222a and 222b. FIG. 4 generally shows an enlarged view of this area 330.

Figure 5:
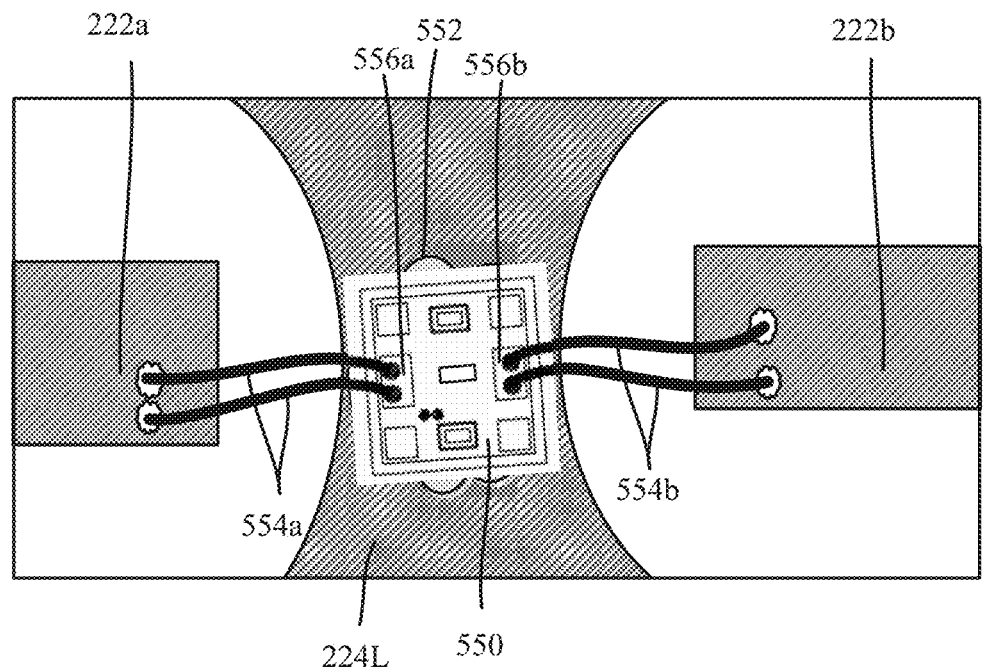
FIG. 5 is a top view of a cryogenic microwave attenuator device in which a chip is affixed to a lower housing portion of the device and bonded to center pins of coaxial connectors according to one or more example embodiments of the present disclosure.

FIG. 5 exemplifies how the microwave signal attenuator chip 550 can be affixed with a fastening material to the lower housing portion 224L, e.g., by epoxy or soldering or otherwise coupling the substrate of the microwave signal attenuator chip 550 to a relatively flat portion near the top of the lower housing portion 224L. Epoxy or solder blob (partially shown) represents this fastening material coupling/high thermal conductivity fastening material 552. Note that one suitable chip is commercially available from Analog Devices, Inc., HMC658, for example, which has a gold plated substrate to facilitate thermal coupling for affixing to the housing component ground plane with high thermal conductivity material, e.g., attached via silver epoxy or high thermal conductivity solder, for example.

Wires 554a and 554b are bonded to input side chip bonding pad 556a and output side chip bonding pad 556b, e.g., gold bonding pads, with the other end of the wires wire bonded to the center pins 222a and 222b, respectively. Aluminum wires can be used at temperatures above the superconducting critical temperature (Tc) of aluminum metal (around 1.3K), that is, in conjunction with the higher temperature plate(s) of a dilution refrigerator; other wire materials, e.g., gold wires, can be used at lower temperatures. Thus, in one implementation, the bonding comprises gold wire bonding to the center pins 222a and 222b of the microwave connectors 202a and 202b. As is understood and as represented in FIG. 5, the wires 554a and 554b can be wire pairs, in case one of the wires of a pair breaks, has poor contact or otherwise fails.

Figure 6:
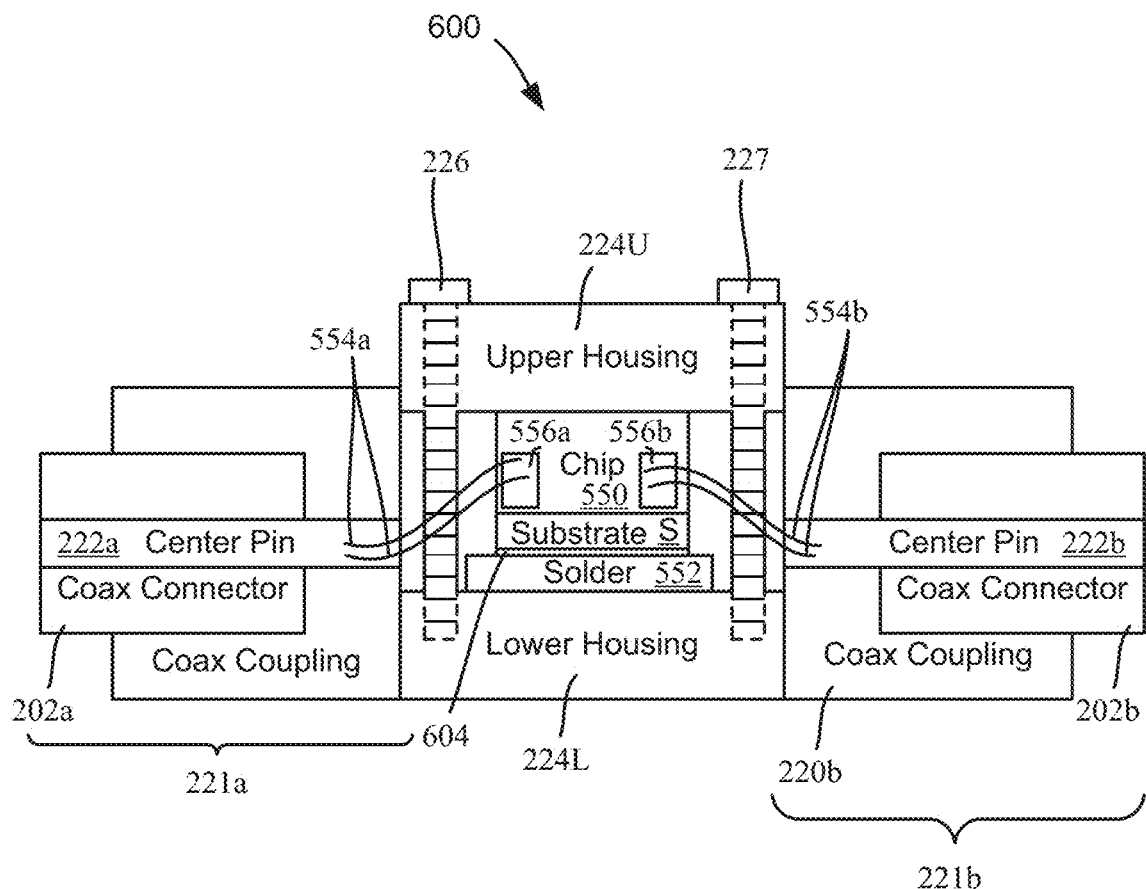
FIG. 6 is a block diagram representation (not to scale) of components of a cryogenic microwave attenuator device according to an example embodiment of the present disclosure.

FIG. 6 shows an example side view of an embodiment of a cryogenic microwave attenuator device 600 as generally described herein. Note that the example components of FIG. 6 are not to scale, in part so as to emphasize certain components, generally labeled in the same way as in FIGS. 1-5. An example of assembling such a device 600 is also described with reference to FIG. 6, although it is understood that a different assembly order from that described is feasible.

In FIG. 6, the two subassemblies 221a and 221b (coax coupling portions 220a and 220b, along with their respectively coupled coax connectors 202a and 202b including respective center pins 222a and 222b), are fastened to respective (left and right, as shown) sides of the lower housing portion 224L. As described above, any suitable fastening technique may be used, however press fit fastening is one suitable technique described herein.

The microwave signal attenuator chip 550 including its substrate S is adhered to the lower housing portion 224L via a high thermal conductivity fastening material 552, e.g., via silver epoxy or high thermal conductivity solder. Wire (pairs) 554a and 554b are bonded to the input side and output side chip bonding pads 556a and 556b, respectively, and to the center pins 222a and 222b, e.g., gold plated at least at the contact part, respectively.

The upper housing portion 224U is fastened, e.g., via screws 226 and 227 to the lower housing portion 224L; when fastened together, the two housing portions 224U and 224L can be collectively considered a housing component 224. Although not shown, any of the components, and in particular those made of copper alloy, can be plated with an oxidation resistant material, particularly gold, although any suitable material that can resist oxidation for an appropriate length of useful device life time, such as silver, can be otherwise used. It is feasible for the entire assembly to be fully embedded in gold plated, high-conductivity copper disks or the like.

As can be seen, efficient thermalization of microwave attenuators is facilitated through the use of an oxygen-free-high-conductivity or electrolytic copper housing component in connection with direct wire bonding between the attenuator chips and microwave connectors. This provides better and faster thermalization of the microwave components, and in particular the microwave attenuators, providing cleaner microwave signals. Moreover, by reducing microwave connectors via same gender connectors at each end, cleaner microwave signals with less reflections are provided.

The technology provides better thermalization of microwave control lines (coax cables), and thus longer coherence times which ultimately lead to overall better performance of quantum computers/processors. Cleaner microwave control pulses exist from reducing the amount of reflection points by eliminating unnecessary microwave connections (which are not always impedance matched, e.g., at 50 Ohms). This corresponds to faster recovery times of the qubits, due to better thermalization, via a more efficient drain of thermal photons.

Moreover, the technology described herein provides for economical considerations, in that certain materials can be used at certain temperatures. For example, aluminum wires can be used above the superconducting critical temperature of aluminum metal, with other (e.g., gold) wires used at lower temperatures, different housing component and connector materials can be used at different temperatures, and so on. There can thus be different models of the assembly package described herein corresponding to their use at different temperatures within the dilution refrigerator.

FIG. 7 exemplifies a method, such as shown as various operations. The method can comprise constructing a package assembly for a microwave signal attenuator device (operation 702), which can comprise (operation 704) affixing a microwave signal attenuator chip 550 to a housing component 224, the housing component 224 having a high thermal conductivity, e.g., of about at least 0.1 Watts per meter-Kelvin at 1K. Operation 706 represents coupling a first microwave connector subassembly 221a to the housing component 224. Operation 708 represents coupling a second microwave connector subassembly 221b to the housing component 224. Operation 710 represents wire bonding an input side chip bonding pad 556a of the microwave signal attenuator chip 550 to a first microwave connector signal conductor (e.g., center pin 222a), and operation 712 represents wire bonding an output side of the microwave signal attenuator chip to a second microwave connector signal conductor (e.g., center pin 222b).

The housing component 224 can comprise an upper housing portion 224U and a lower housing portion 224L, and wherein the affixing the microwave signal attenuator chip 550 to the housing component can comprise affixing the microwave signal attenuator chip 550 to the lower housing portion 224L. Aspects can comprise containing the microwave signal attenuator chip 550 in the housing component 224 by fastening the upper housing portion 224U to the lower housing portion 224L.

One or more aspects comprise a device 600, the device comprising a cryogenic microwave attenuator component, the cryogenic microwave attenuator component comprising a housing component 224 (FIG. 2). The housing component 224 can comprise a microwave attenuator (e.g., microwave signal attenuator chip 550), and the housing component 224 can have thermal conductivity of about at least 0.1 Watts per meter-Kelvin at 1K. The device 600 can further comprise a microwave connector 202a, the microwave connector 202a comprising a signal conductor (e.g., center pin 222a) that is direct wire coupled to the microwave attenuator (e.g., microwave signal attenuator chip 550).

The housing component can comprise a copper alloy material. The housing component can be plated with an oxidation-resistant material. The oxidation-resistant material can comprise gold. The housing component can comprise a substantially oxygen-free-high-conductivity copper material. The housing component can comprise an electrolytic copper material.

The signal conductor can comprise a connector center pin that is direct wire coupled to the microwave attenuator chip via one or more gold wires. The cryogenic microwave attenuator device can be used in conjunction with a dilution refrigerator plate at a temperature above a superconducting critical temperature of aluminum metal, and for such dilution refrigerator plate(s), the signal conductor can comprise a connector center pin that is direct wire coupled to the microwave attenuator chip via one or more aluminum wires.

The microwave connector can comprise a first microwave connector coupled to an input signal side of the microwave attenuator chip, and the device can further comprise a second microwave connector coupled to an output signal side of the microwave attenuator chip, wherein the first microwave connector can be a same gender as the second microwave connector. The microwave connector can comprise a first female microwave connector coupled to an input signal side of the microwave attenuator chip, and the device can further comprise a second female microwave connector coupled to an output signal side of the microwave attenuator chip.

The attenuator chip can comprise a plated substrate that is affixed to the housing component via material having a thermal conductivity of about at least 1 Watts per meter-Kelvin at 1K. The thermal conductivity material can comprise silver epoxy.

One or more aspects comprise a device 600, the device 600 comprising a housing component 224 that contains a microwave signal attenuator chip 550, the housing component 224 comprising a metal having a thermal conductivity of about at least 0.1 Watts per meter-Kelvin at 1K. Aspects can comprise a first subassembly 221a that can be mechanically coupled to the housing component 224, and the first subassembly 221a can comprise a first microwave connector 202a having a first microwave signal conductor (e.g., center pin 222a) electrically coupled to an input side of the microwave signal attenuator chip (e.g., at input side chip bonding pad 556a). A second subassembly 221b can be mechanically coupled to the housing component 224, and the second subassembly 221b can comprise a second microwave connector 202b having a second microwave signal conductor (e.g., center pin 222b) electrically coupled to an output side of the microwave signal attenuator chip (e.g., at output side chip bonding pad 556b).

The housing component can comprise a copper alloy housing component plated with an oxidation-resistant material.

The first signal conductor can comprise a connector center pin that is direct wire coupled to the input side of the microwave attenuator chip via one or more wires. The first microwave connector can comprise a female gender microwave connector and the second microwave connector can comprise a female gender microwave connector.

The housing component can be coupled to a plated substrate the microwave signal attenuator chip via a material having a thermal conductivity of about at least 0.1 Watts per meter-Kelvin at 1K. The housing component can comprise a lower housing portion to which the microwave signal attenuator chip is attached, and an upper housing portion that fastens to the lower housing portion to contain the microwave signal attenuator chip.

A device 600 can comprise an input microwave connector 202a comprising an input signal conductor (e.g., center pin 222a), the input signal conductor electrically coupled to an input of a microwave signal attenuator (e.g., microwave signal attenuator chip 550, at input side chip bonding pad 556a). The device can further comprise an output microwave connector 202b, which can comprise an output signal conductor (e.g., center pin 222b), the output signal conductor electrically coupled to an output of the microwave signal attenuator (e.g., microwave signal attenuator chip 550, at output side chip bonding pad 556b). The device can further comprise a housing component 224, the housing component 224 having a thermal conductivity of about at least 0.1 K Watts per meter-Kelvin at 1K, the housing component 224 affixed to the microwave signal attenuator chip 550 with a material having a thermal conductivity of about at least 1 Watts per meter-Kelvin at 1K, and the housing component 224 mechanically coupled to the input microwave connector 202a and to the output microwave connector 202b.

The input microwave connector component, the output microwave connector component and the housing component can be plated with an oxidation resistant material. The housing component can comprise a copper alloy.

Aspects can comprise a cryogenic microwave attenuator device 600, comprising a housing component 224 having a thermal conductivity of about at least 1 Watts per meter-Kelvin at 1K, the housing component 224 coupled to dissipate thermal energy of a microwave signal attenuator (e.g., microwave signal attenuator chip 550) contained within the housing component 224. An input microwave connector 202a can be mechanically coupled to the housing component 224, and the input microwave connector component can comprise an input signal conductor (e.g., center pin 222a), the input signal conductor direct wire bonded to an input of the microwave signal attenuator chip 550. An output microwave connector 202b can be mechanically coupled to the housing component 224, and the output microwave connector 202b can comprise an output signal conductor (e.g., center pin 222b), the output signal conductor direct wire bonded to an output of the microwave signal attenuator chip 550. The housing component 224 can be coupled to dissipate thermal energy of the microwave signal attenuator chip 550 via a high thermal conductivity fastening material 552 having a thermal conductivity of about at least 1 Watts per meter-Kelvin at 1K.

What has been described above include mere examples. It is, of course, not possible to describe every conceivable combination of components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a cryogenic microwave attenuator device, the cryogenic microwave attenuator device comprising a housing component outside of and affixed to a microwave attenuator chip that is distinct from the cryogenic microwave attenuator device, the housing component having thermal conductivity of about at least 0.1 Watts per meter-Kelvin at 1 degree Kelvin, wherein the thermal conductivity is selected to facilitate functionality of a quantum processor; and
a microwave connector, the microwave connector comprising a signal conductor that is direct wire coupled to the microwave attenuator chip, wherein the microwave connector is directly connected to a coax coupling portion disposed to directly connect to the housing component via the coax coupling portion adapted to directly slide on to the structure of the housing component, and wherein the signal conductor is directly connected to and provided via the coax coupling portion.

2. The device of claim 1, wherein the housing component comprises a copper alloy housing material.

3. The device of claim 2, wherein the housing component is plated with an oxidation-resistant material.

4. The device of claim 3, wherein the oxidation-resistant material comprises gold.

5. The device of claim 1, wherein the housing component comprises a substantially oxygen-free, high-conductivity copper material having thermal conductivity of about at least 0.1 Watts per meter-Kelvin at 1 degree Kelvin.

6. The device of claim 1, wherein the housing component comprises an electrolytic copper material.

7. The device of claim 1, wherein the signal conductor comprises a connector center pin that is direct wire coupled to the microwave attenuator chip via one or more gold wires.

8. The device of claim 1, wherein the cryogenic microwave attenuator device is to be used in conjunction with a dilution refrigerator plate at a temperature above a superconducting critical temperature of aluminum metal, and wherein the signal conductor comprises a connector center pin that is direct wire coupled to the microwave attenuator chip via one or more aluminum wires.

9. The device of claim 1, wherein the microwave connector comprises a first microwave connector coupled to an input signal side of the microwave attenuator chip, and further comprising a second microwave connector coupled to an output signal side of the microwave attenuator chip, and wherein the first microwave connector is a same gender as the second microwave connector.

10. The device of claim 1, wherein the microwave connector comprises a first female microwave connector coupled to an input signal side of the microwave attenuator chip, and further comprising a second female microwave connector coupled to an output signal side of the microwave attenuator chip, wherein the first female microwave connector and the second female microwave connector are designed to be same gender to reduce signal reflections.

11. The device of claim 1, wherein the microwave attenuator chip comprises a plated substrate that is affixed to the housing component via fastening material having a fastening material thermal conductivity of about at least 1 Watts per meter-Kelvin at 1 degree Kelvin.

12. The device of claim 11, wherein the fastening material comprises silver epoxy.

13. A device, comprising:
a housing component that contains a microwave signal attenuator chip, the housing component comprising a metal having a thermal conductivity of about at least 1 Watts per meter-Kelvin at 1 degree Kelvin, wherein the thermal conductivity is selected to facilitate functionality of a quantum processor;
a first subassembly that is mechanically coupled to the housing component, the first subassembly comprising a first microwave connector having a first microwave signal conductor electrically coupled to an input side of the microwave signal attenuator chip, wherein the microwave signal attenuator chip is outside of the housing component, wherein the first microwave connector is directly connected to a coax coupling portion disposed to directly connect to the housing component via the coax coupling portion adapted to directly attach to the housing component, and wherein the first microwave signal conductor is directly connected to and provided via the coax coupling portion; and
a second subassembly that is mechanically coupled to the housing component, the second subassembly comprising a second microwave connector having a second microwave signal conductor electrically coupled to an output side of the microwave signal attenuator chip.

14. The device of claim 13, wherein the housing component comprises a copper alloy housing component plated with an oxidation-resistant material.

15. The device of claim 13, wherein the first microwave signal conductor comprises a connector center pin that is direct wire coupled to the input side of the microwave signal attenuator chip via one or more wires.

16. The device of claim 13, wherein the first microwave connector comprises a female gender microwave connector and the second microwave connector comprises another female gender microwave connector.

17. The device of claim 13, wherein the housing component is coupled to a plated substrate of the microwave signal attenuator chip via a fastening material having a fastening material thermal conductivity of about at least 0.1 Watts per meter-Kelvin at 1 degree Kelvin.

18. The device of claim 13, wherein the housing component comprises a lower housing portion to which the microwave signal attenuator chip is attached, and a upper housing portion that fastens to the lower housing portion to contain the microwave signal attenuator chip.

19. A device, comprising:
an input microwave connector component comprising an input signal conductor, the input signal conductor electrically coupled to an input of a microwave signal attenuator chip;
an output microwave connector component comprising an output signal conductor, the output signal conductor electrically coupled to an output of the microwave signal attenuator chip; and
a housing component, the housing component having a first thermal conductivity of about at least 0.1 Watts per meter-Kelvin at 1 degree Kelvin, the housing component affixed to the microwave signal attenuator chip with a fastening material having a second thermal conductivity of about at least 0.1 Watts per meter-Kelvin at 1 degree Kelvin, and the housing component directly mechanically connected to the input microwave connector component via a coax coupling portion formed to be received in a recess of the housing component, and to the output microwave connector component, wherein the first thermal conductivity are the second thermal conductivity are selected to facilitate functionality of a quantum processor.

20. The device of claim 19, wherein the input microwave connector component, the output microwave connector component and the housing component are plated with an oxidation resistant material.

21. The device of claim 19, wherein the housing component comprises a copper alloy.

22. A cryogenic microwave attenuator device, comprising:
a housing component having a thermal conductivity of about at least 0.1 Watts per meter-Kelvin at 1 degree Kelvin, the housing component coupled to dissipate thermal energy of a microwave signal attenuator chip contained within the housing component, wherein the thermal conductivity is selected to facilitate functionality of a quantum processor;
an input microwave connector component mechanically coupled to the housing component, the input microwave connector component comprising an input signal conductor, the input signal conductor direct wire bonded to an input of the microwave signal attenuator chip wherein the input microwave connector is directly connected to a coax coupling portion disposed to directly connect to the housing component via the coax coupling portion adapted to directly attach to the housing component, and wherein the input signal conductor is directly connected to and provided via the coax coupling portion; and an output microwave connector component mechanically coupled to the housing component, the output microwave connector component comprising an output signal conductor, the output signal conductor direct wire bonded to an output of the microwave signal attenuator chip.

23. The cryogenic microwave attenuator device of claim 22, wherein the housing component is coupled to dissipate thermal energy of the microwave signal attenuator chip via a fastening material having a thermal conductivity of about at least 0.1 Watts per meter-Kelvin at 1 degree Kelvin.

24. A method, comprising:
constructing a package assembly for a microwave signal attenuator device, comprising,
affixing a microwave signal attenuator chip to a housing component, the housing component having a thermal conductivity of about at least 0.1 Watts per meter-Kelvin at 1 degree Kelvin, wherein the thermal conductivity is selected to facilitate functionality of a quantum processor;
coupling a first microwave connector subassembly to the housing component;
coupling a second microwave connector subassembly to the housing component, wherein the first microwave connector subassembly comprises:
  a first microwave connector directly connected to a coax coupling portion disposed to directly connect to the housing component via the coax coupling portion; and
  a first microwave signal conductor directly connected to and provided via the coax coupling portion and disposed to slide onto a recess of the housing component;
wire bonding an input side of the microwave signal attenuator chip to a first microwave connector signal conductor; and
wire bonding an output side of the microwave signal attenuator chip to a second microwave connector signal conductor.

25. The method of claim 24, wherein the housing component comprises an upper housing portion and a lower housing portion, and wherein the affixing the microwave signal attenuator chip to the housing component comprises affixing the microwave signal attenuator chip to the lower housing portion, and further comprising, containing the microwave signal attenuator chip in the housing component by fastening the upper housing portion to the lower housing portion.

* * * * *